United States Patent
Dauelsberg et al.

(10) Patent No.: US 6,849,241 B2
(45) Date of Patent: Feb. 1, 2005

(54) DEVICE AND METHOD FOR DEPOSITING ONE OR MORE LAYERS ON A SUBSTRATE

(75) Inventors: Martin Dauelsberg, Aachen (DE); Marcus Schumacher, Kerpen (DE); Holger Juergensen, Aachen (DE); Gerd Strauch, Aachen (DE); Piotr Strzyzewski, Herzogenrath-Kohlscheid (DE)

(73) Assignee: Aixtron AG. (DE)

( * ) Notice: Subject to any disclaimer, the term of this patent is extended or adjusted under 35 U.S.C. 154(b) by 113 days.

(21) Appl. No.: 10/210,247

(22) Filed: Aug. 1, 2002

(65) Prior Publication Data

US 2003/0056720 A1 Mar. 27, 2003

Related U.S. Application Data

(63) Continuation of application No. PCT/EP01/01103, filed on Feb. 2, 2001.

(30) Foreign Application Priority Data

Feb. 4, 2000 (DE) .......................................... 100 04 899

(51) Int. Cl.$^7$ ........................ C30B 25/02; C30B 25/04
(52) U.S. Cl. ........................ 423/328.2; 117/86; 117/89; 117/90; 117/94; 117/102
(58) Field of Search ................................ 117/84, 86, 89, 117/90, 94, 102, 104; 118/715, 729, 725, 724; 423/328.2

(56) References Cited

U.S. PATENT DOCUMENTS

| 5,595,606 A | 1/1997 | Fujikawa et al. ........... 118/725 |
| 5,871,586 A | 2/1999 | Crawley et al. ............ 118/715 |
| 5,976,261 A | 11/1999 | Moslehi et al. ............. 118/719 |

FOREIGN PATENT DOCUMENTS

| DE | 198 13 523 A1 | 10/1999 |
| EP | 0 821 084 A1 | 1/1998 |

*Primary Examiner*—Felisa Hiteshew
(74) *Attorney, Agent, or Firm*—St. Onge Steward Johnston & Reens LLC (57) ABSTRACT

The invention relates to a device and method for depositing one or more layers onto at least one substrate placed inside a reaction chamber. The layers are deposited while using a liquid or solid starting material for one of the reaction gases utilized, which are fed via a gas admission unit to the reaction chamber where they condense or epitaxially grow on the substrate. The gas admission unit comprises a multitude of buffer volumes in which the reaction gasses enter separate of one another, and exit through closely arranged outlet openings while also being spatially separate of one another. The temperature of reaction gases is moderated while passing through the gas admission unit.

20 Claims, 8 Drawing Sheets

DEVICE AND METHOD FOR DEPOSITING ONE OR MORE LAYERS ON A SUBSTRATE

This application is a continuation of pending International Application No. PCT/EP01/01103 filed Feb. 2, 2001, which designates the United States and claims priority from German Application No. 10004899.4 filed Feb. 4, 2000.

FIELD OF THE INVENTION

The invention relates to a process for producing one or more layers on at least one substrate disposed in a reaction chamber, using at least one liquid or solid starting material for at least one of the reaction gases used and, if appropriate, at least one further reaction gas which is gaseous at room temperature.

A process of the generic type and a device of the generic type are known from WO 95/02711 or WO 99/02756. It should be noted that reference is made expressly to these two documents for an explanation of all the details which are not described further in the present document. The known devices have at least one reservoir for the starting material(s) (precursors), which are present in individual or mixed form. Furthermore, in a manner which is known per se, there is a reaction chamber in which the substrate(s) are disposed in particular on one or more susceptors and in which the layers are to be applied to the substrate. A delivery device, which is controlled by a control unit, delivers the starting material(s) via at least one delivery line from the reservoir(s) to the region in which the starting material(s) are to be evaporated (known as the "evaporator").

In the device which is known from WO 95/02711, the precursor(s) (starting materials) are fed in the "form of droplets" to a downstream, temperature-controlled evaporation chamber, where they are evaporated, or are introduced directly into the reactor through temperature control of the containers for the gaseous product.

Particularly in the case of periodic injection, this does not result in sufficiently homogeneous distribution of the reaction gases in the reaction chamber under all operating conditions.

Moreover, the reaction gases are often not injected into the reaction chamber at an optimum temperature.

A corresponding statement also applies to the device for condensation coating which is known from U.S. Pat. No. 5,554,220.

The invention is based on the object of refining a device of the generic type and a corresponding process in such a manner that the flaws caused by in homogeneities in the distribution of the admitted gases and/or in the temperature of the admitted gases in the composition of the layers produced, as may occur in the prior art, are avoided.

This object is achieved by the invention described in the claims.

According to the invention, the reaction gas(es), before entering the reaction chamber, are admitted to a gas inlet unit, which has a plurality of separate gas paths, the number of which is less than or equal to the number of reaction gases used, and a multiplicity of outlet openings, which are disposed in such a way that the various reaction gases, as a mean, enter the reaction chamber homogeneously over the substrate dimensions but spatially separated, in such a manner that they substantially do not react with one another before reaching the surface of the substrate(s). The temperature of the reaction gas(es) over their respective gas path is controlled, i.e. the gases are heated or cooled by the gas inlet unit; in particular, the temperature of the gases can be regulated or held at a constant temperature.

Although gas inlet units of this type, which are also known as showerheads, are known in processes other than that which forms the preamble, they are not known in the form which is provided according to the invention, in which the temperature control and in particular the temperature regulation of the gases—which have optionally undergone preliminary temperature control measures—takes place in the gas inlet unit (U.S. Pat. No. 5,871,586).

Particularly simple setting and in particular regulation of the temperature of the gases which are to be admitted is achieved if the temperature of the individual gases is controlled or regulated by controlling or regulating the horizontal and/or vertical temperature gradient in the gas inlet unit to different temperatures.

In addition, in the process according to the invention, the volumetric flow of the gases entering the gas inlet unit can be controlled, in particular by closed-loop control. The gas inlet unit can also be used to admit at least one carrier gas and/or a purge gas.

The process according to the invention for coating at least one substrate may preferably be used in a CVD, MOCVD or OVPD process (condensation coating) and may serve in particular for the production of perovskites or coated perovskites which belong to the group of oxide materials, such as for example $BaSrTiO_3$, $PbZrTiO_3$, $SrBi_2Ta_2O_9$, or for the production of organic layers, in particular small molecules and polymers for, for example, thin-film components, such as OLEDs or solar cells.

The reactor according to the invention for coating a substrate, which can be used in particular to carry out a process according to the invention, has a gas supply system, which provides at least two different gases or gas mixtures separately, a reaction chamber, in which at least one substrate which is to be coated is disposed on at least one heated or cooled susceptor, and at least one temperature-controlled gas inlet unit (showerhead), which admits at least two of the gases or gas mixtures separately into the reaction chamber, and which has a multiplicity of gas outlet openings which are combined to form groups and the number of which corresponds to the number of gases or gas mixtures which are to be admitted separately, one of the gases or gas mixtures emerging from each group of gas outlet openings into the reaction chamber.

A reactor of this type is refined by the following features:
the gas inlet unit has a plate, in or at which the gas outlet openings are provided,
the temperature of the plate is controlled directly or indirectly by the substrate or susceptor heating or cooling, and/or the temperature of the heated or cooled substrate(s) or susceptor(s) is controlled directly or indirectly,
adjustable thermal resistances, which are formed by gas volumes, are disposed between the plate and the base body of the gas inlet unit and/or the base body of the gas inlet unit and a heat sink or heat source.

The inventive construction means that it is not necessary for the gas inlet unit to be, for example, electrically heated. Rather, the temperature of the gas inlet unit is controlled by means of one or more adjustable thermal resistances, which allow control or regulation of the heat flux from warmer locations to the gas inlet unit and/or of the heat flux from the gas inlet unit to cooler locations in the reaction chamber. The result is a gas inlet unit which is of simple structure yet can nevertheless be regulated easily and accurately.

In particular, it is possible for the susceptor(s) and/or the substrate(s) to be cooled or heated directly or indirectly, and for the heat flux from or to the susceptors or substrates to be controlled or regulated.

In a preferred construction of the device according to the invention, the latter is characterized by the following features:

buffer volumes for the various gases or gas mixtures which are to be admitted separately are disposed on that side of the plate which is remote from the outlet openings, the number of which buffer volumes at least corresponds to the number of the groups, and which volumes are connected, via lines, both to the gas supply system and to the respectively associated gas outlet openings in terms of flow, the buffer volumes are thermally coupled both to the plate and to a heat sink or heat source.

This construction has the advantage that the gases located in the buffer volumes remain in the gas inlet unit for a sufficiently long time for their temperature to be controlled in the desired way. The coupling via a variable thermal resistance may be affected in particular by means of an intermediate volume in which there is at least one medium under an adjustable pressure.

Furthermore, it is preferred if the buffer volumes, in the direction normal to the heated or cooled plate, are disposed above one another in a housing of the gas inlet unit. This construction results in a buffer store of differentiated temperature, so that it is readily possible to control the temperature of gases, if appropriate to different temperatures.

The construction of the housing which is radially symmetrical in the normal direction leads to a homogeneous temperature distribution in the radial direction.

If a plurality of media with different thermal heat conductivities is used in the intermediate volume(s), it is easily possible to set the thermal resistance. Particularly rapid control or regulation is obtained if the media used are gases or gas mixtures.

The construction according to which the intermediate volume is sealed with respect to the space in which the substrate(s) are arranged means that the gas flow in the reaction chamber is not disturbed.

As heat source or heat sink it is preferably possible to use temperature-controlled parts of the reactor, as specified in the claims. In particular, the temperature of the temperature-controlled plate may be controlled by the substrate(s) or susceptor(s) by heat transfer by means of thermal radiation, thermal conduction, etc.

In order to set the radial and/or vertical temperature gradient, the gas inlet unit may be constructed in a very wide variety of ways, for example it may consist of at least one material and in particular may be constructed as horizontal or vertical multilayer structure comprising one or more different materials. Passages may be provided inside the multilayer structure for temperature control purposes. Examples of materials which may be used include aluminum, stainless steel, quartz glass and ceramic.

Furthermore, the gas inlet unit may have at least one intermediate plate, which may under certain circumstances be removable, is thermally coupled to opposite boundary walls of the gas inlet unit in order to set the vertical and/or horizontal temperature gradient and in particular may delimit the buffer volumes. In particular, the at least one intermediate plate may have at least one opening. Furthermore, at least two of the intermediate plates may be connected via thermal bridges in order to set the vertical, horizontal and/or radial heat flux. It is also possible for at least one of the intermediate plates to be used for gas diversion within the gas inlet unit. As an alternative or in addition, it is possible for at least one of the intermediate plates to be disposed outside the gas inlet unit and to serve as a baffle plate.

Furthermore, small tubes may connect the gas outlet openings which are provided in the heated plate to the individual buffer volumes. In this case, it is advantageous if the openings are profiled in a suitable way.

The device according to the invention is suitable in particular for the production of layers in which at least some of the process gases are produced from solid or liquid precursors. Furthermore, in addition to process gases, the gas inlet unit may introduce at least one carrier gas and/or a purge gas.

Exemplary embodiments of the invention are explained below with reference to appended drawings, in which.

The reactor which is illustrated in purely diagrammatic form in the figures has a reactor shell in the form of the wall 31. This reactor shell 31 surrounds a base body 32 of the reactor. A susceptor 14, which is the support for one or more substrates 2, lies in the base body 32, which is, for example, cylindrical in form. The susceptor 14 is heated from below by means of a heater 16. However, as an alternative to the heater 16, it is also possible to provide a cooling means in order to keep the susceptor 14 at, for example, room temperature, so that a layer can form on the substrate 2 lying on the susceptor 14 as a result of condensation.

Above the base body 32 or the susceptor 14 there is a space 1 which is closed off from the outside world in a gastight manner and forms a reaction chamber. Gases 4, 5, 6 are introduced into the reaction chamber 1 by means of a gas inlet unit 8 disposed above the susceptor 14. These gases are or contain reaction gases, which for example, can condense on the susceptor. In another process, however, these gases may also chemically react with one another in the gas phase or, the preferred option, on the substrate surface itself, the substrate surface 2 being coated with the reaction product of this reaction. The coating may involve crystal growth. The layer growth is generally in polycrystalline form. In special cases, the layer growth may also take place in monocrystalline form.

Figure 1:
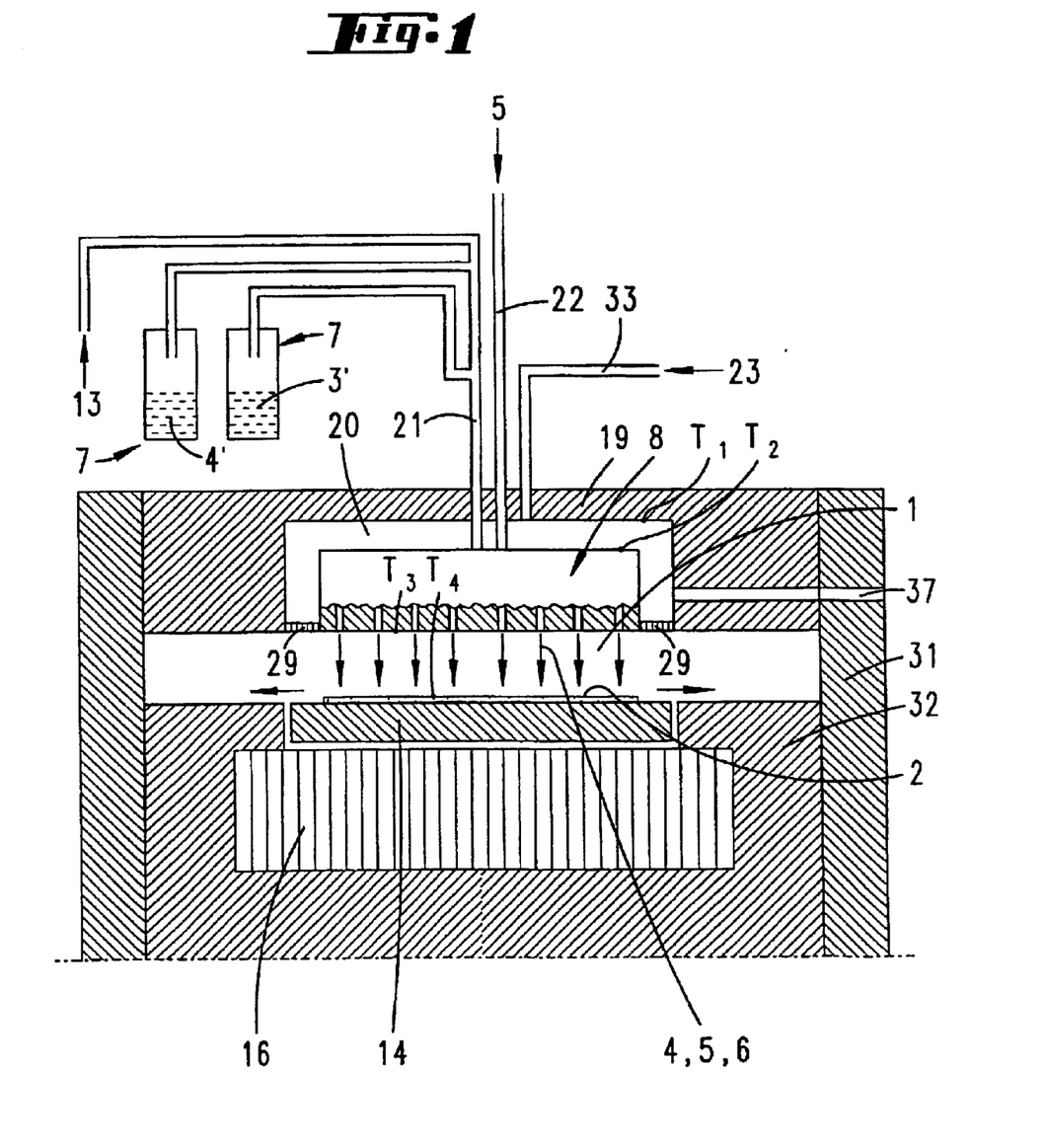
FIG. 1 shows a diagrammatic cross-sectional illustration of a device according to the invention.
Figure 7:
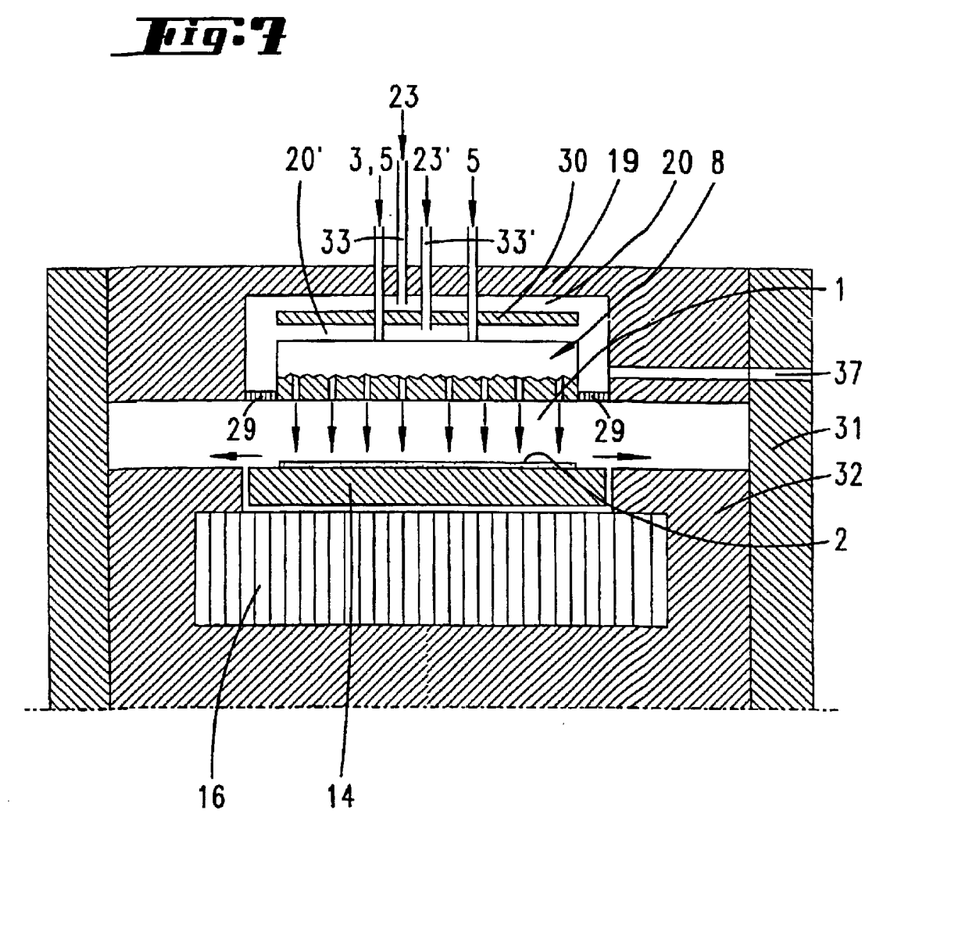
FIG. 7 shows an illustration corresponding to FIG. 1 illustrating a further exemplary embodiment of the invention.

The gas inlet unit 8 is located in a cavity in the reactor cover 19. This reactor cover 19 can be held at a preset temperature by means of a heater (not shown) or a cooling arrangement (likewise not shown). The gas inlet unit 8 is not in surface contact with the reactor cover 19. Rather, the space 20 between the reactor cover 19 and the outer surface of the gas inlet unit 8 is gas-purged. FIG. 1 and FIG. 7 illustrate a purge gas lines 33 and 37 for this purpose, into which a purge gas 23 can be introduced and evacuated. The purge gas is selected according to the process which takes place in the reaction chamber 1. It is preferably an inert gas. In the case of an MOCVD process, it may be nitrogen or a mixture of nitrogen and hydrogen. However, it may also be hydrogen. In the case of other processes, for example in the case of the oxidation processes described in the introduction, it may also be a mixture of noble gases, for example a mixture of helium and argon. It is preferably a mixture of gases which have thermal conduction properties which deviate considerably from one another, so that the thermally conductive transfer from the reactor cover 19 to the gas inlet unit 8 can be set by means of the composition of the mixture of the two gases. To ensure that the heat transfer takes place by means of thermal conduction, a corresponding pressure has to be set in the gap 20. If the process pressure in the reactor chamber 1 is below this pressure, the gap 20 is isolated from the reaction chamber 1. This can be affected by means of insulators 29 which are gastight or act as a throttle, so that gas can flow out of the gap 20 into the reaction chamber 1. The gap 20 may also have its own gas discharge line. The radially outer gas discharge line of the reaction chamber is not illustrated.

Feedlines 21, 22, through which reaction gases 4, 5, 6 are passed from a gas supply member into the gas inlet unit 8, project through the gap 20. The gases 3, 4 may be liquid starting materials 4', 3' which have been brought into vapor form. However, the starting materials 3', 4' may also be solids which then sublime to form the reaction gases 3, 4. The solids 3' or liquids 4' are stored in containers 7 which are diagrammatically illustrated in FIG. 1. The gases 3, 4 which emerge from the containers 7 pass via the pipeline 21 through the reactor cover 19 into the gas inlet unit 8. A carrier gas or purge gas 13 may additionally be fed into the pipeline 21.

Figure 9:
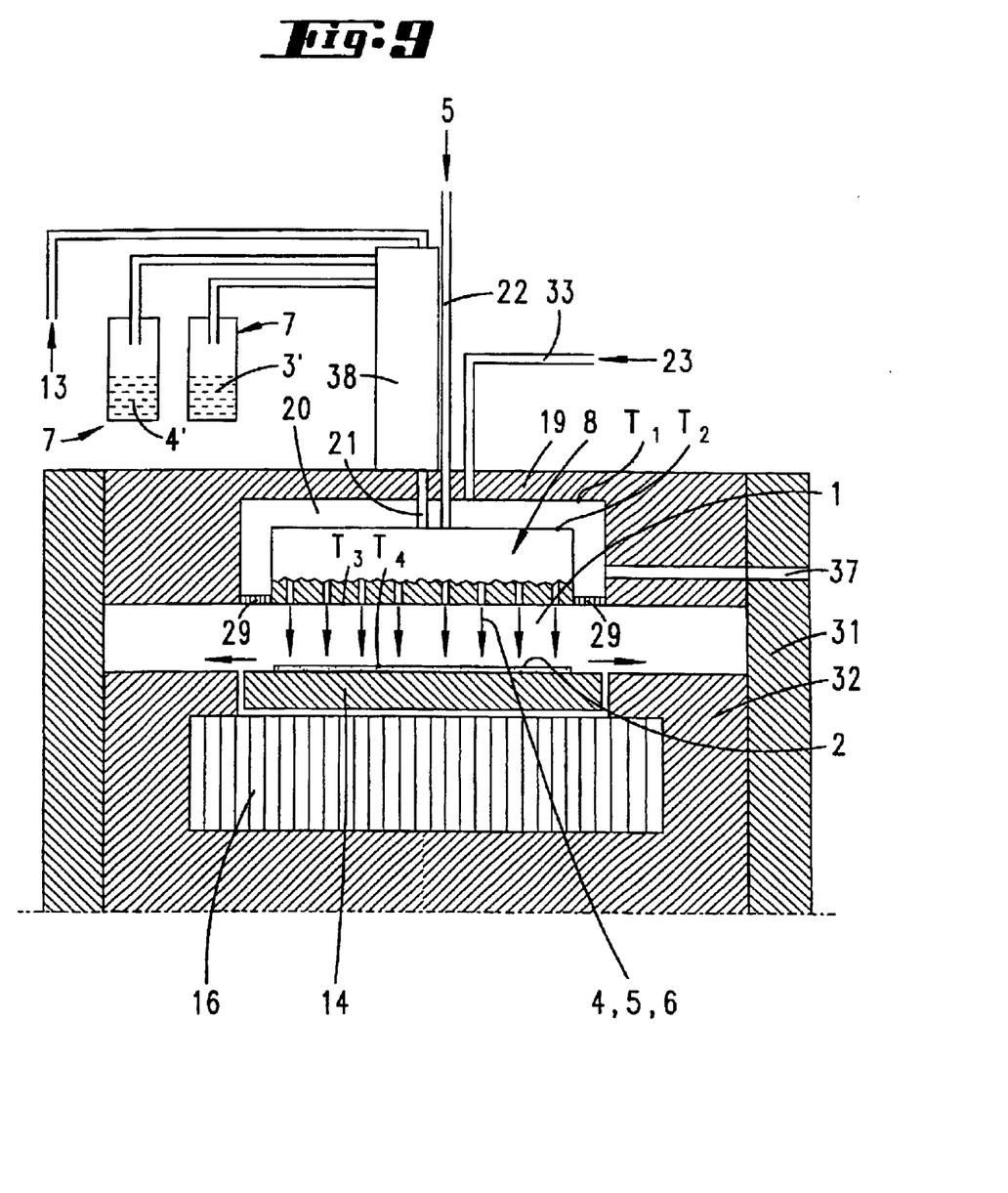
FIG. 9 shows an illustration corresponding to FIG. 1 showing a further exemplary embodiment.
Figure 10:
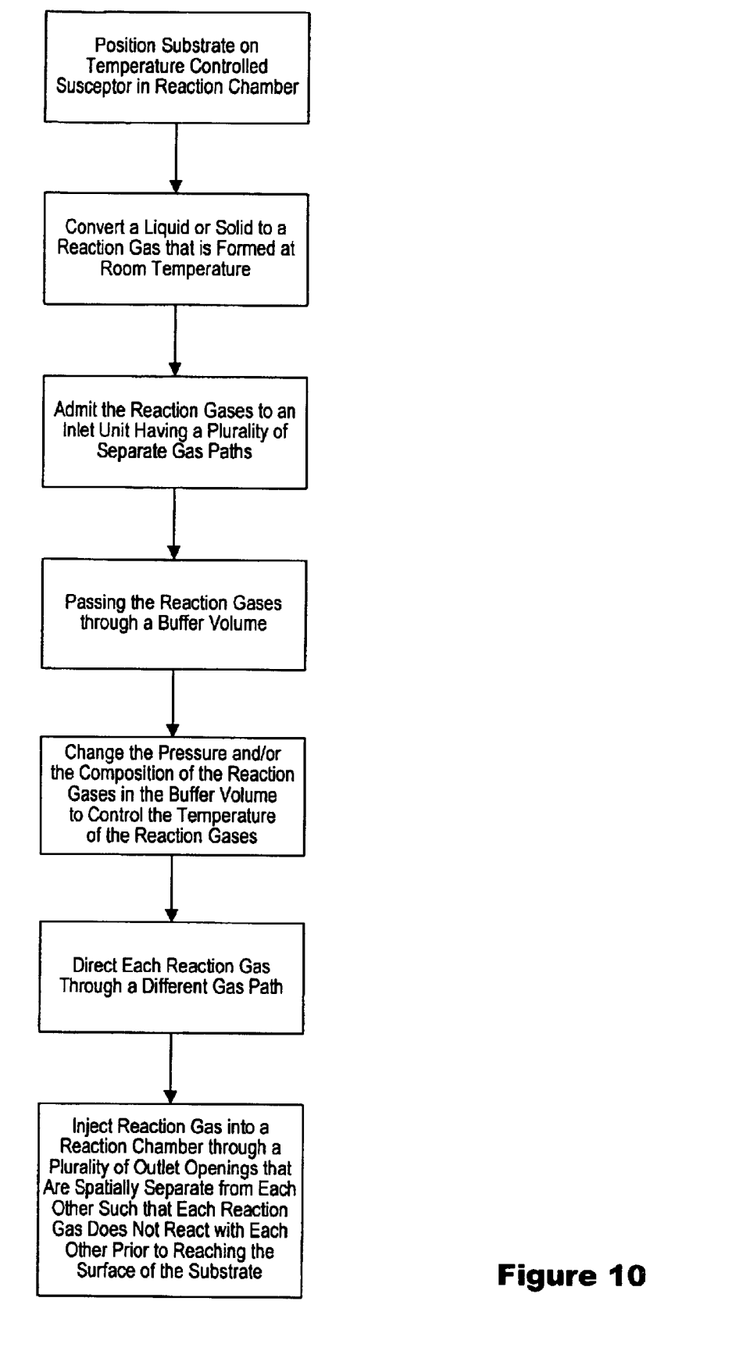
FIG. 10 is a flow diagram illustrating one advantageous embodiment of the present invention.

In the exemplary embodiment illustrated in FIG. 9, liquid starting materials are introduced into a temperature-controlled evaporator 38. There, the starting materials are evaporated in a known way through the supply of heat either via surface contact or preferably through uptake of heat from the hot carrier gas and are introduced into the reactor via the gas line 21. The containers 7 in which the starting materials are located in this exemplary embodiment are preferably not heated.

A gaseous starting material 5 passes into the gas inlet unit 8 through the feedline 22.

Figure 2:
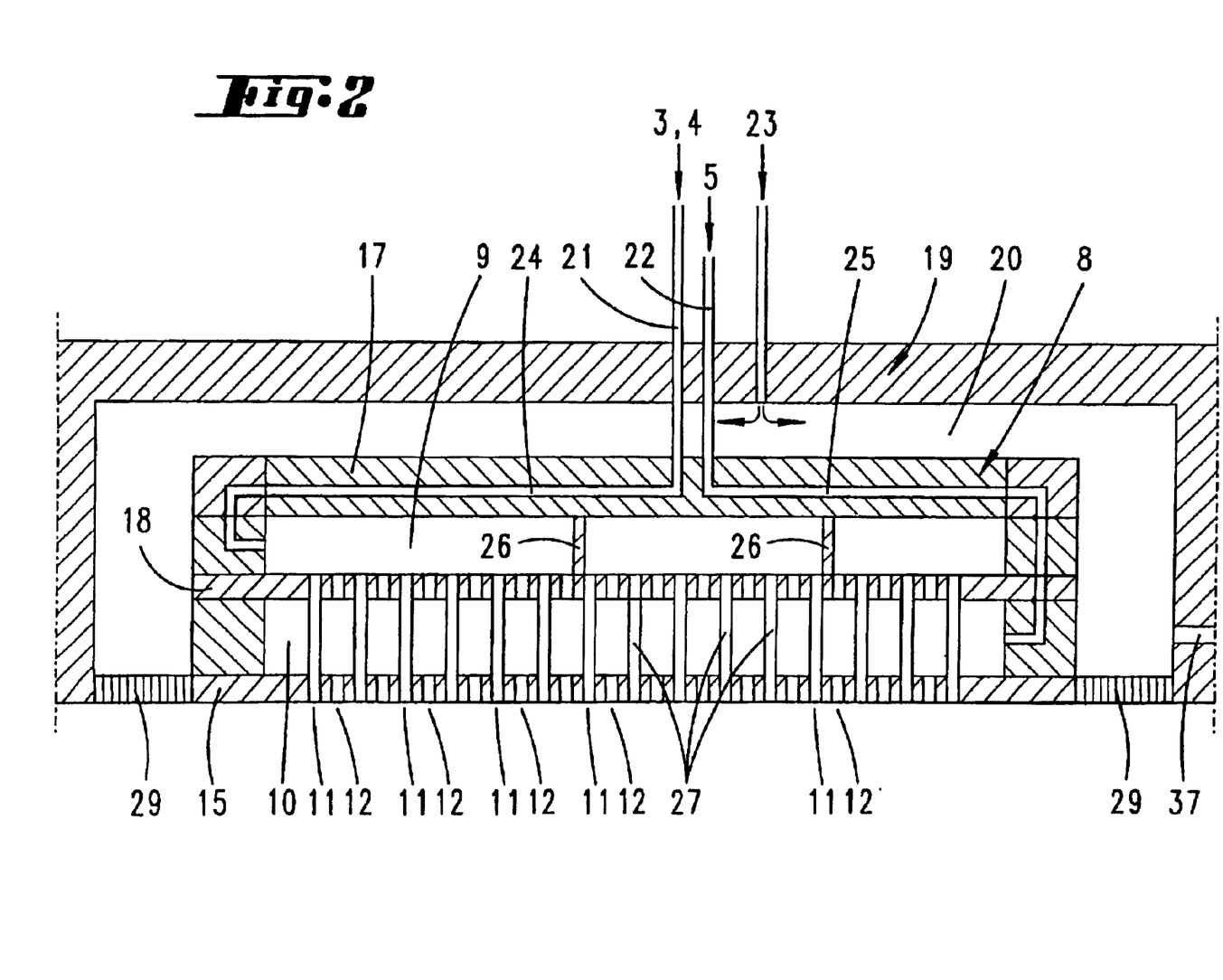
FIG. 2 shows an enlarged illustration of an excerpt of the gas inlet unit, likewise in diagrammatic form.

For a description of the gas inlet unit 8, reference is made to FIG. 2. The gas inlet unit 8 has a cover plate 17, which is in the form of a circular disk and in which there is a multiplicity of passages 24, 25 which run in the shape of a star from the center toward the edge. The passages 24 are connected to the pipeline 21, through which the reaction gases 3, 4 are fed to the outer edge of an upper chamber 9. Through the passages 25, the reaction gas 5 which is supplied through the feedline 22 flows into the edge region of a lower chamber 10 which lies below upper chamber 9. Upper and lower chambers 9, 10 are separated from one another in a gastight manner and form buffer volumes. Upper and lower chambers 9, 10 are separated by an intermediate plate 18 which, like the cover plate 17, may be manufactured from for instance, a metal material. Intermediate plate 18 and the cover plate 17 may be connected to one another by thermally conductive bridges 26. If the bridges 26 are omitted, the heat transfer from the cover plate 17 to the center plate 18 takes place through thermal conduction of the reaction gases 3, 4 which have been introduced into upper chamber 9 and/or the additional carrier or purge gas 13 and via the outer edge region of the gas inlet unit 8. The cover plate 17 is heated or cooled substantially by heat transfer via the gap 20.

The intermediate plate 18 has a multiplicity of openings, to which are connected tubes 27 which project through the chamber 10 into a perforated plate 15, which forms the base plate of the gas inlet unit 8. Between the plate 15 and the intermediate plate 18 there is the buffer volume 10, into which the reaction gas 5 flows. In the space between the tubes 27 or their outlet openings 11 there are openings 12 through which the reaction gas 5 located in the buffer volume 10 can escape.

The plate 15 is therefore configured as a perforated plate with a multiplicity of outlet openings 11, 12 which lie close together. The outlet openings 11 which are assigned to the tubes 27 form a first group, from which only the reaction gases 4 and 5 located in upper chamber 9 escape. The reaction gas 5 which is located in the lower chamber 10 escapes from the outlet openings 12 which are assigned to the second group and are each adjoined by the outlet openings 11.

The pressures in upper and lower chambers 9, 10 are selected in such a way with respect to the diameters and number of the outlet openings 11, 12 that a uniform flow profile emerges over the entire area of the plate 15. The height of the reaction chamber 1 is selected in such a way that the gas streams which emerge from the outlet openings 11, 12 have mixed by the time they have reached the substrate 2.

The transfer of heat from the intermediate plate 18 to the plate 15 is effected by thermal conduction. The thermal conduction may take place via the tubes 27 if the latter are manufactured from thermally conductive material. The thermal conduction may also take place via the gas which is located in the buffer volume 10 and via the outer edge of the gas inlet unit 8.

Figure 3:
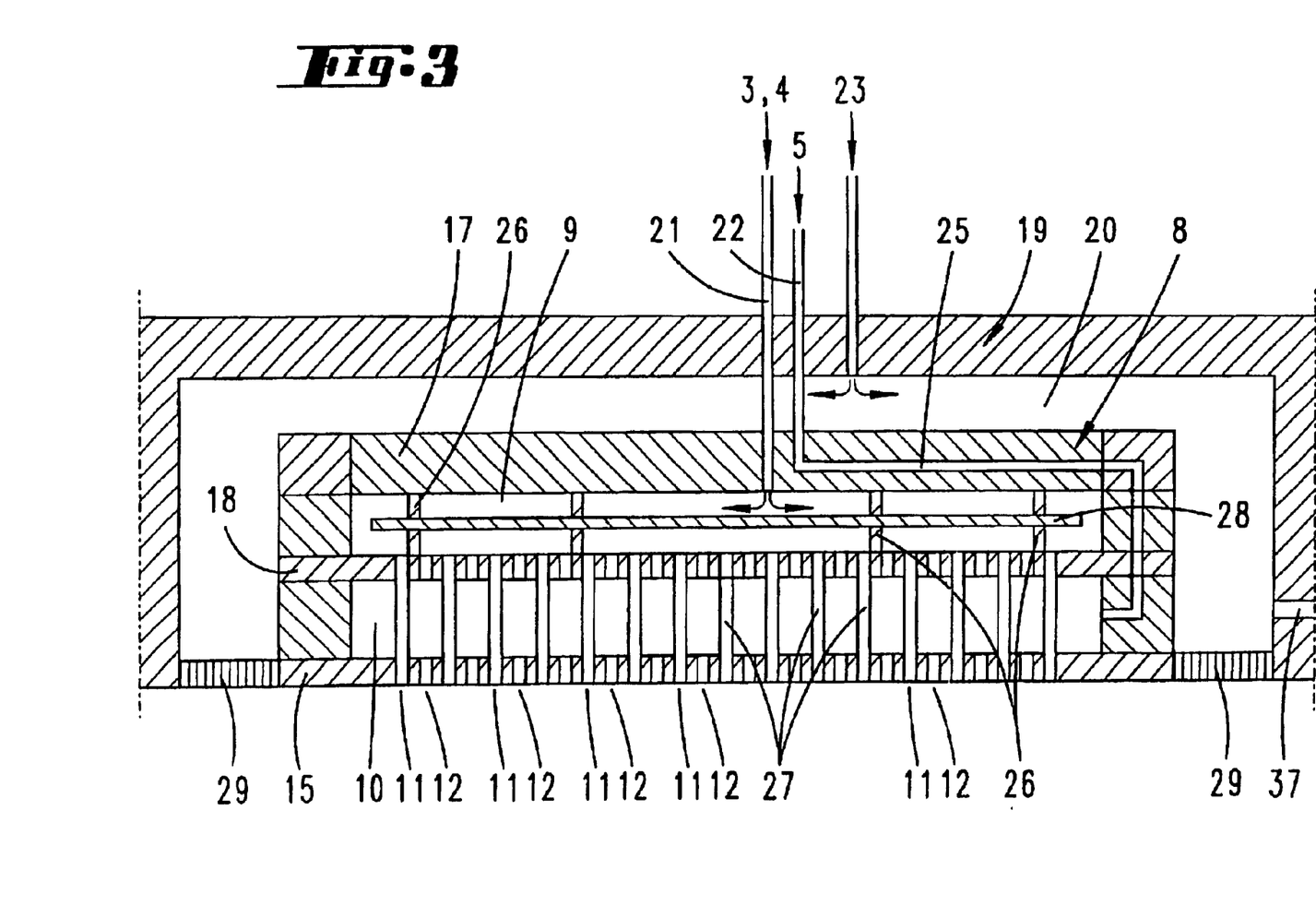
FIG. 3 shows an illustration corresponding to that shown in FIG. 2 in a modified form.

In the case of the gas inlet unit illustrated in FIG. 3, the upper chamber 9 has an intermediate plate 28. This intermediate plate 28 may likewise be connected to the cover plate 17 by means of bridges 26. It is also possible to provide bridges 26 for connecting the intermediate plate 28 to the intermediate plate 18. The intermediate plate 18 additionally acts as a baffle wall. The gas stream emerging from the feedline 21 flows onto its center and is diverted radially outward, so that it then flows around the edge of the intermediate plate 28 and likewise enters the upper chamber 9 from the outside inward.

Figure 5:
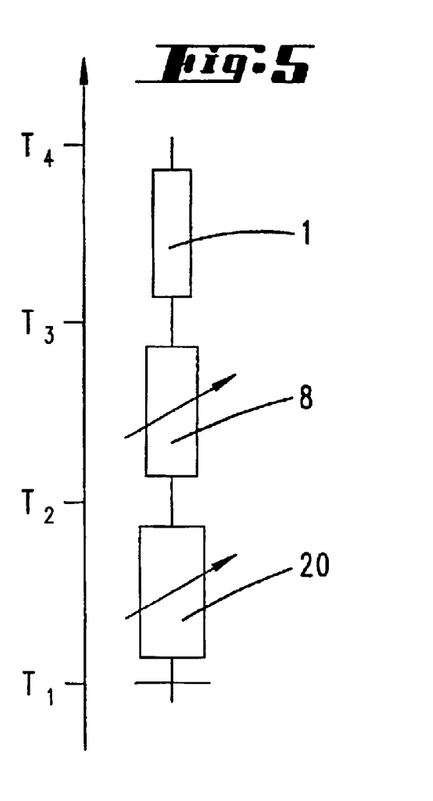
FIG. 5 shows an illustration in circuit diagram form of the technical effect of the buffer volumes.

FIG. 5 illustrates the temperature-controlling/-regulating property of the components which have been described above. The action of the gap 20 is in this case illustrated as an adjustable thermal resistance. Likewise the gas inlet unit 8. At the location which is indicated by $T^1$ in FIG. 1, at the reactor cover 19, a temperature T1, which may, for example, be 1000° C., prevails. The temperature T4, which is the surface temperature of the substrate 2, may be 200° C. These two temperatures can be preset by heating the reactor cover 19 or by heating or cooling the susceptor 14. The temperatures T2, T3, i.e. the temperature of the cover plate 17 or of the plate 15, may be set by changing the geometries or the composition or the pressure of the gases 23 in the gap 20 or gases 3, 4, 5 and 13 in upper and lower chambers 9, 10.

Figure 6:
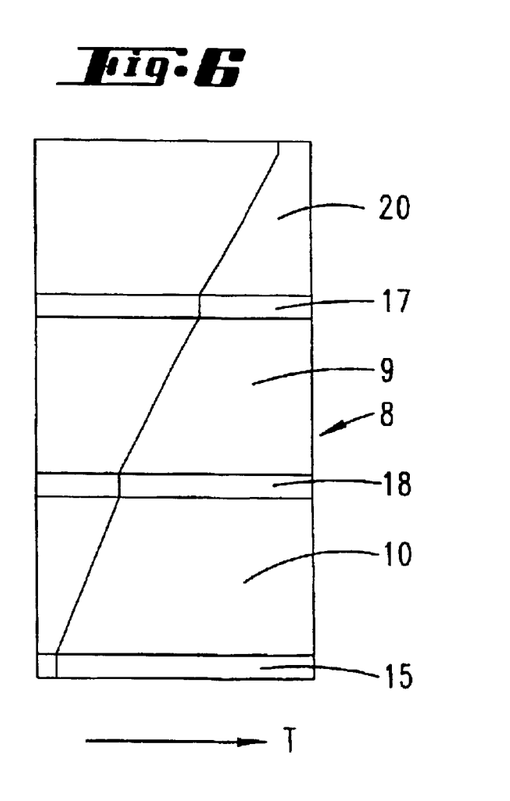
FIG. 6 shows the temperature profile in the region of the buffer volumes.

A temperature profile is illustrated in FIG. 6. At the plate 15, a low temperature of, for example, 400° C. prevails. A temperature of, for example, 800° C. may prevail at the cover plate 17.

In another process, which can be carried out using the device described above, the substrate 2, as a result of suitable heating by means of the heater 16, is at a temperature which is higher than the temperature T1 of the reactor cover, which is held at room temperature, for example by means of cooling. The temperatures T2 and T3 can be set by regulation by suitable choice of the gas and its pressure in the gap 20 and by setting of the flow parameters or the geometry in the gas inlet unit 8. For example, if the reaction gases are gases which decompose above a reaction temperature, the parameters are set in such a way that the temperature in the buffer chamber assigned to this gas is lower than the decomposition temperature. In the case of reaction gases in which condensation of the reaction gases is expected below a condensation temperature, the corresponding temperatures in the buffer chamber are kept correspondingly high.

The temperature of the gases which enter the gas inlet unit through the lines 21, 22 is controlled by the gas inlet unit 8.

Figure 8:
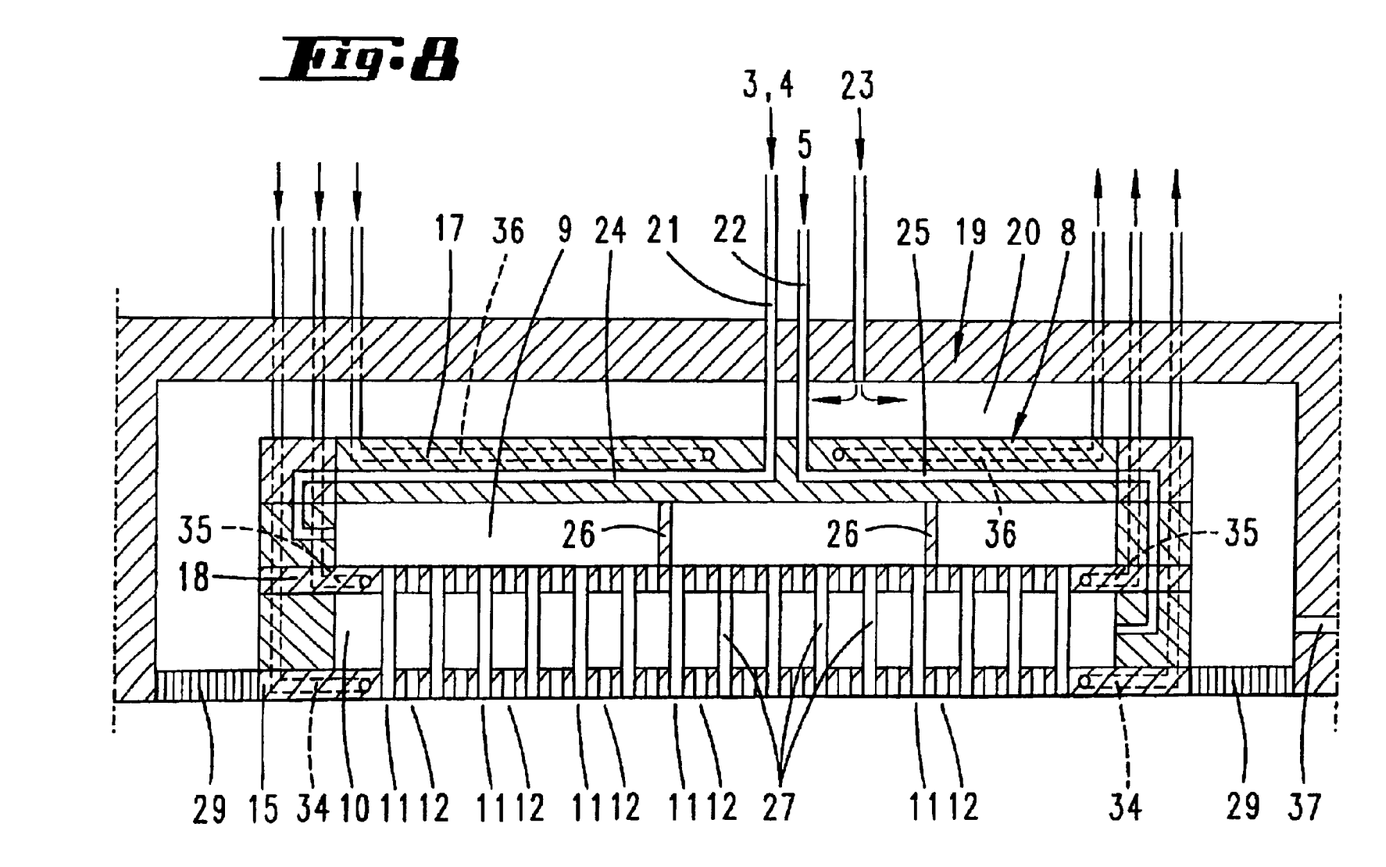
FIG. 8 shows an illustration corresponding to FIG. 2 showing a further exemplary embodiment.

In the exemplary embodiment illustrated in FIG. 8, the temperature is controlled by means of media, for example gases, which flow through passages 34, 35 or 36. The temperature may also be controlled by means of a heating wire. The passage 34 passes through the perforated plate 15. A cooling or heating medium may flow through passage 34. The passage 35 is assigned to the intermediate plate 18. It is also possible for a cooling or heating medium to flow through this passage. Finally, there is also the passage 36 in the cover plate 17, through which a medium of this type can also flow. In FIG. 8, the passages 34, 35, 36 are only illustrated in diagrammatic form. They are arranged in the individual plates in such a way that the temperature of the plates is controlled uniformly. They may, for example, pass in meandering form through the plates. The passages may be configured as bores which are in each case connected to one another at the end sides. However, it is also possible for the passages to be milled in by means of grooves and covered by a plate, so that the plates 15, 18, 17 comprise two plates which rest on top of one another and are joined to one another. The gas inlet unit 8 or the plates thereof are then configured as a horizontal multi layer structure.

To ensure that the escape of the gases from the outlet openings 11, 12 is as laminar as possible, the openings are widened in the shape of a funnel. This is shown in FIG. 4.

Figure 4:
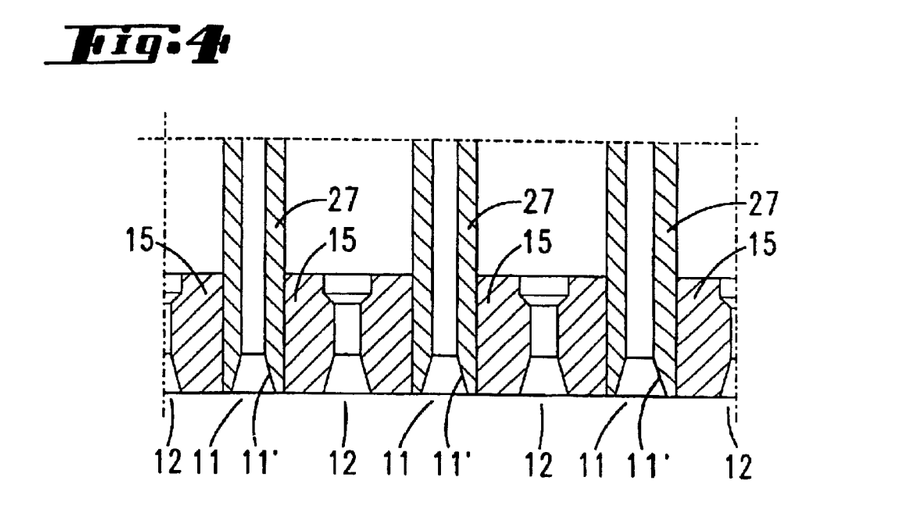
FIG. 4 shows an enlarged illustration of the plate of the gas inlet unit.

In the exemplary embodiment illustrated in FIG. 7, the gas inlet unit may be constructed as shown in FIG. 3 or FIG. 4. In this exemplary embodiment, there is a further intermediate plate, in the form of a baffle plate 30, in the gap 20. The gas 23 which enters the gap 20 through the line 33 flows onto this baffle plate 30. In this exemplary embodiment, an additional gas line may lead into the gap 20. This line 33' may project through the baffle plate 30, so that the gas stream 23' emerging from the line 33' flows onto the cover plate 17.

The purge gases 23, 23' which are introduced into the gap 20 may have undergone preliminary temperature control measures.

All features disclosed are (inherently) pertinent to the invention. The disclosure content of the associated/appended priority documents (copy of the prior application) is hereby incorporated in its entirety in the disclosure of the application, partly for the purpose of incorporating features of these documents in claims of the present application.

What is claimed is:

1. A device for coating a substrate comprising:
   a gas supply system, which provides at least two different gases or gas mixtures separately,
   a reaction chamber, in which at least one substrate which is to be coated is disposed on at least one heated or cooled susceptor,
   at least one temperature-controlled gas inlet unit, which admits at least two of the gases or gas mixtures separately into the reaction chamber via a plurality of gas paths, and which has a multiplicity of gas outlet openings,
   the gas inlet unit having a plate, in or at which the gas outlet openings are provided,
   the plate being located on the side of the gas inlet unit directed towards the susceptor, and heat being directly or indirectly supplied to or dissipated from the plate by the substrate or susceptor heating or cooling and/or by the heated or cooled substrate(s), and having a gas purged gap between the gas inlet unit and a heat sink or heat source for dissipating or supplying heat, the heat resistance of the gap being adjustable by changing the gas composition,
   characterized by
   a separation or throttle between the gap and the reaction chamber, so that the heat resistance of the gas purged gap is also adjustable via the gas pressure, and
   at least one buffer volume disposed between the plate and the gap, the buffer volume being associated with the gas inlet unit and formed in particular by the gas paths, the heat resistance of the buffer volume being adjustable in particular by changing the pressure and/or the gas composition of the gas in the buffer volume,
   the gas outlet openings being combined in groups, the number of the groups corresponding to the number of the gases or gas mixtures to be admitted separately, one of the gases or gas mixtures exiting from each group of gas outlet openings into the reaction chamber.

2. The device according to claim 1, wherein the buffer volumes, in the direction normal to the heated or cooled plate, are disposed above one another in a housing of the gas inlet unit.

3. The device according to claim 2, wherein the heat source or heat sink is a temperature-controlled part of the reactor, and the heat sink is in particular a cooled part of the reactor and in particular is the water-cooled or heated reactor cover.

4. The device according to claim 3, wherein the gas inlet unit is formed as a horizontal or vertical multilayer structure comprising one or more different materials.

5. The device according to claim 4, wherein the gas inlet unit has at least one intermediate plate which is thermally coupled to opposite boundary walls of the gas inlet unit in order to set the vertical and/or horizontal temperature gradient.

6. The device according to claim 5, wherein at least one of the intermediate plates has at least one opening.

7. The device according to claim 6, wherein at least two of the intermediate plates are connected via thermal bridges in order for the vertical, horizontal and/or radial heat flux to be set.

8. The device according to claim 7, wherein at least one of the intermediate plates is used for gas diversion within the gas inlet unit.

9. The device according to claim 8, wherein at least one of the intermediate plates is disposed outside the gas inlet unit and serves as a baffle plate.

10. The device according to claim 9, wherein the intermediate plates separate the buffer layer.

11. The device according to claim 10, wherein in the gas inlet unit there is at least one passage which is used to set the temperature gradient in the gas inlet unit.

12. The device according to claim 11, wherein small tubes connect the gas outlet openings to the individual buffer volumes.

13. A process for depositing one or more layers on at least one substrate which is disposed on a temperature controlled susceptor in a reaction chamber, using at least one liquid or solid starting material for at least one of the reaction gases used, and if appropriate at least one further reaction gas which is in gas form at room temperature, in which process the liquid or solid starting material(s) are converted from the liquid or solid phase directly into the vapor phase in one or more evaporators before they enter the reaction chamber, the reaction gas(es) being admitted to a gas inlet unit, which has a plurality of separate gas paths, the number of which is less than or equal to the number of reaction gases used, which gas paths have a multiplicity of outlet openings, which are disposed in such a way that the various reaction gases enter the reaction chamber distributed uniformly over the substrate area, and that the temperature of the reaction gas(es) on their respective gas path is controlled by the gas inlet unit, heat being supplied to or dissipated from the gas inlet unit by the susceptor on the side of the gas inlet unit directed towards the susceptor, and, on the other side, heat is dissipated to a heat sink or supplied from a heat source through a gas purged gap, the heat resistance of which is adjustable by changing the gas composition, wherein the reaction gases enter the reaction chamber spatially separate in such a manner that they substantially do not react with one another before reaching the surface of the substrate(s), for a sealing or throttling separation of the gap with respect to the reaction chamber, the heat resistance of the gap is also adjustable by changing the gas pressure, and by means of at least one buffer volume between the two sides of the gas inlet unit, the buffer volume being associated with the gas inlet unit, and in particular formed by the gas paths, a variable heat resistance is set by changing the pressure and/or the composition of the gases in the buffer volume.

14. The process according to claim 13, wherein the temperature of the individual gases is controlled or regulated by setting the horizontal and/or vertical temperature gradient in the gas inlet unit to different temperatures.

15. The process according to claim 14, wherein the coating process is a CVD, MOCVD or OVPD process (condensation coating).

16. The process according to claim 15, wherein it is used for the production of one-component, two-component or multicomponent oxides, the perovskites belonging to the group of oxide materials, or coated perovskites, such as for example $BaSrTiO_3$, $PbZrTiO_3$, $SrBi_2Ta_2O_9$, or for the production of organic layers, in particular small molecules or polymers for, for example, thin-film components, such as OLEDs, OTFTs or solar cells.

17. The process according to claim 16, wherein the gas inlet unit is also used to admit at least one carrier gas and/or a purge gas.

18. A method for uniformly depositing layers on a substrate comprising the steps of:

positioning a substrate on a temperature controlled susceptor in a reaction chamber;

converting a liquid or a solid to reaction gases formed at room temperature;

admitting the reaction gases to an inlet unit having a plurality of separate gas paths that are at least equal to the number of reaction gases used;

passing the reaction gases through a buffer volume;

controlling a temperature of the reaction gases in the buffer volume;

directing each reaction gas through a different gas path;

injecting each reaction gas into a reaction chamber, each reaction gas being injected through a plurality of outlet openings spatially separate from each other such that each reaction gas does not react with one another prior to reaching a surface area of the substrate.

19. The method according to claim 18 wherein the step of controlling the temperature of the reaction gases includes changing the pressure of the buffer volume.

20. The method according to claim 18 wherein the step of controlling the temperature of the reaction gases includes changing a composition of the reaction gases in the buffer volume.

* * * * *